(12) United States Patent
Ueda

(10) Patent No.: US 7,823,860 B2
(45) Date of Patent: Nov. 2, 2010

(54) DRIVE OF AN ELECTROMAGNETIC VALVE WITH A COIL BY SUPPLYING HIGH VOLTAGE FROM A DISCHARGING CAPACITOR TO THE COIL

(75) Inventor: Kouji Ueda, Kariya (JP)

(73) Assignee: Denso Corporation, Kariya (JP)

( * ) Notice: Subject to any disclaimer, the term of this patent is extended or adjusted under 35 U.S.C. 154(b) by 406 days.

(21) Appl. No.: 11/902,067

(22) Filed: Sep. 18, 2007

(65) Prior Publication Data

US 2008/0083895 A1    Apr. 10, 2008

(30) Foreign Application Priority Data

Sep. 20, 2006    (JP) ............... 2006-254658

(51) Int. Cl.
*F02D 41/20* (2006.01)
(52) U.S. Cl. .................. 251/129.04; 361/156
(58) Field of Classification Search ............ 251/129.04, 251/129.15; 361/155, 156, 154, 152; 123/300
See application file for complete search history.

(56) References Cited

U.S. PATENT DOCUMENTS

| | | | | |
|---|---|---|---|---|
| 4,628,885 | A * | 12/1986 | Ogburn et al. ............... | 123/490 |
| 5,109,885 | A * | 5/1992 | Tauscher ............... | 251/129.04 |
| 5,936,827 | A * | 8/1999 | Dressler et al. ............. | 361/154 |
| 5,954,030 | A * | 9/1999 | Sturman et al. ......... | 251/129.04 |
| 5,960,627 | A | 10/1999 | Krampe et al. | |
| 6,123,092 | A | 9/2000 | Torii | |
| 6,236,554 | B1 * | 5/2001 | Groppo et al. ............... | 361/155 |
| 6,363,895 | B1 * | 4/2002 | Butzmann et al. ...... | 251/129.15 |
| 6,400,106 | B1 | 6/2002 | Magruder et al. | |
| 6,407,593 | B1 | 6/2002 | Kawamoto et al. | |

| | | | |
|---|---|---|---|
| 2003/0140899 | A1 | 7/2003 | Bolz |

FOREIGN PATENT DOCUMENTS

DE    196 36 507    3/1997

(Continued)

OTHER PUBLICATIONS

Extended European Search Report dated May 15, 2009, issued in corresponding European Application No. 07116652.4-1263.

(Continued)

*Primary Examiner*—John Bastianelli
(74) *Attorney, Agent, or Firm*—Nixon & Vanderhye P.C.

(57) ABSTRACT

An electromagnetic valve driving apparatus is provided for reducing emission noise generated when a discharge switching element is turned off. In the apparatus, a discharging capacitor stores electrical energy for performing discharge to a coil in an electromagnetic valve and charging means generates voltage from a power source voltage, which voltage is higher than that of the power source voltage. A discharge switching element is provided in series in a current path extending from the discharging capacitor to an up-stream side terminal of the coil. Controlling means turns on/off the discharge switching element. Circulating means is provided in the current path for circulation of current to the coil. Sub-discharging means is provided in the current path, for starting discharge to the coil when the discharge switching element is turned off, and for circulating current to the coil through the circulating means when the discharge to the coil is completed.

20 Claims, 13 Drawing Sheets

FOREIGN PATENT DOCUMENTS

| | | |
|---|---|---|
| EP | 1 288 973 | 3/2003 |
| FR | 2 772 972 | 6/1999 |
| JP | H 08-022336 | 1/1996 |
| JP | 09-306732 | 11/1997 |
| JP | 11-055937 | 2/1999 |
| JP | 11-141381 | 5/1999 |
| JP | 2001-015332 | 1/2001 |
| JP | 2003-065128 | 3/2003 |
| JP | 2003-086422 | 3/2003 |
| JP | 2005-330934 | 12/2005 |

OTHER PUBLICATIONS

Office Action dated May 25, 2010 issued in corresponding Japanese Application No. 2006-254658 with an at least partial English-language translation thereof.

* cited by examiner

DRIVE OF AN ELECTROMAGNETIC VALVE WITH A COIL BY SUPPLYING HIGH VOLTAGE FROM A DISCHARGING CAPACITOR TO THE COIL

CROSS-REFERENCE TO RELATED APPLICATION

This application is based on and claims the benefit of priority from earlier Japanese Patent Application No. 2006-254658 filed Sep. 20, 2006, the description of which is incorporated herein by reference.

BACKGROUND OF THE INVENTION

1. Technical Field of the Invention

The present invention relates to an apparatus for driving electromagnetic valves, and in particular, to the apparatus adapted to discharge high-voltage energy charged to a discharging capacitor, into a coil in an electromagnetic valve to enhance the operational responsiveness of the electromagnetic valve.

2. Related Art

Fuel injection valves are used, for example, for injecting and supplying fuel to individual cylinders of an internal combustion engine loaded on a vehicle. Electromagnetic valves have been used as fuel injection valves, which are opened by supplying current to coils. Such fuel injection valves are driven and controlled by a fuel injection control apparatus. In particular, a fuel injection apparatus controls a current supply period and current supply timing for each of the coils, so that the amount and timing of fuel injection can be controlled for the internal combustion engine.

A type of such a fuel injection control apparatus is known as disclosed in Japanese Patent Application Laid-Open No. 2001-015332. In this apparatus, a power source voltage is raised by a booster circuit to charge a discharging capacitor. At the beginning of a driving period for supplying current to the coils, the high-voltage electrical energy stored in the discharging capacitor is charged to the coils of fuel injection valves to pass a predetermined high current (so-called peak current) therethrough. In this way, the fuel injection valves are promptly brought into an open state. Then, a current of a certain level is passed through the coils until the driving period expires, keeping the fuel injection valves in an open state.

With reference to FIG. 12, an example of a particular configuration of this type of fuel injection control apparatus will be explained.

A fuel injection control apparatus 100 of FIG. 12 is purposed to drive electromagnetic solenoid type unit injectors (hereinafter just referred to as "electromagnetic valve(s)") for injecting and supplying fuel to, for example, cylinders of a multi-cylinder diesel engine loaded on a vehicle. FIG. 12 shows only one of the electromagnetic valves for the respective cylinders. The following explanation is focused on the driving of a single electromagnetic valve 21 shown in FIG. 12. In this example, transistors used as switching elements are MOSFETs, which hereinafter are referred to as "switching elements".

The electromagnetic valve 21 is a normally-closed type electromagnetic valve provided with a coil 21a. When current is supplied to the coil 21a, a valve body, not shown, moves against the bias force of a return spring to a valve-opening position so that the fuel is injected. When the current supply to the coils 21a is finished, the valve body returns to a valve-closing position, or an original position, so that the fuel injection is stopped.

The fuel injection control apparatus 100 includes: an output terminal P1, to which high(Hi)-side terminal of the coil 21a of the electromagnetic valve 21 is connected; an output terminal P2, to which a low(Low)-side terminal of the coil 21a is connected; a switch 13 for driving the electromagnetic valve, which is serially connected between an end of a current detection resistor R1 and the output terminal P2, the other end of the resistor R1 being connected to a ground line (GND=0V); a switch 12 whose one output terminal is connected to a power source line, to which voltage (battery voltage) VB of an on-vehicle battery is supplied as power source voltage; a diode D2 for preventing back flow, whose anode is connected to the other output terminal of the switch 12 and whose cathode is connected to the output terminal P1; a capacitor (discharging capacitor) C1 for passing peak current to the coil 21a, the peak current serving for promptly bringing the electromagnetic valve 21 into an open state; a DCDC converter 23 for boosting the battery voltage VB to generate voltage higher than the battery voltage VB, so that the capacitor C1 can be charged by being supplied with the high voltage through a diode D4; a switch 11 for connecting a positive terminal (opposite to the ground line side) of the capacitor C1 to the output terminal P1 (and further to the upstream-side terminal of the coil 21a); a diode D3 for a flywheel (circulation), whose anode is connected to the ground line and whose cathode is connected to the output terminal P1; and a control circuit 25 made up of a microcomputer, for example, for controlling the switches 11 to 13 and the DCDC converter 23.

The fuel injection control apparatus 100 also includes: an energy recovery path 22, which is provided between the output terminal P2 and the positive terminal of the capacitor C1 to recover flyback energy circulated from the downstream-side of the coil 21a to the capacitor C1; and a diode D1, which is provided upstream of the energy recovery path 22 with its cathode being directed to the capacitor C1 to control the direction of current.

Practically, the output terminal P1 is commonly used between a plurality of electromagnetic valves for the respective cylinders, i.e. coils of the individual electromagnetic valves are connected to this single output terminal P1. The output terminal P2 and the switch 13 are provided for the coil of every electromagnetic valve.

The DCDC converter 23 includes an inductor and a switch, which are arranged in series between the power source line of the battery voltage VB and the ground line. It is known that the capacitor C1 is charged by the flyback voltage through the diode D4. The flyback voltage is generated in the inductor by the turning on/off of the switch.

Operation of the fuel injection control apparatus 100 configured as described above will be described with reference to a timing diagram of FIG. 13.

The control circuit 25 determines a driving period for supplying current to a coil of an electromagnetic valve for every cylinder, based on engine operation information, such as engine speed and accelerator opening, and turns on the switch 13 corresponding to the electromagnetic valve in question only during the driving period.

Prior to the commencement of the driving period of each electromagnetic valve, the control circuit 25 operates the DCDC converter 23 to charge the capacitor C1 up until the charge voltage (positive terminal voltage) of the capacitor reaches a target voltage Vc1.

As shown in FIG. 13, when time comes for starting the driving period for any one of the electromagnetic valves, the control circuit 25 turns on the switch 13 corresponding to the electromagnetic valve in question, while also turning on the switch 11. In the example shown in FIG. 13, the switch 12 is also turned on together with the switch 11.

Then, an electrical connection is established between the positive terminal of the capacitor C1 and the output terminal P1 through the switch 11, so that the energy charged to the capacitor C1 is discharged to the coil 21a, whereby current supply is started for the coil 21a. The discharge of the capacitor C1 at this moment permits high current (peak current) to flow through the coil 21a, for promptly bringing the electromagnetic valve 21 into an open state.

In FIG. 13, the "Current at output terminal P1" indicated by a broken line is coil current that flows through the coil 21a. During the discharge from the capacitor C1, the diode D2 prevents the battery voltage VB from sneaking out of the output terminal P1, whose potential has been raised, to the power source line. Further, even when the switch 13 is turned on, the diode D1 will prevent current from directly flowing into the switch 13 from the positive terminal of the capacitor C1 through the energy recovery path 22.

The control circuit 25 turns on the switch 11 and, after lapse of a certain period, turns off the switch 11. It should be appreciated that another configuration may be used, in which coil current is detected in terms of voltage generated at the resistor R1, and when the coil current reaches a target current, or a peak current, the switch 11 is turned off.

Thus, at the beginning of the driving period, the switch 11 is turned on to permit the capacitor C1 to discharge current to the coil 21a, whereby high current flows through the coil 21a to accelerate valve-opening response of the electromagnetic valve 21.

While the switch 11 is turned on, the control circuit 25 inhibits the DCDC converter 23 from charging current to the capacitor C1 in order to stabilize the discharge current of the capacitor C1.

After turning off the switch 11, the control circuit 25 performs on/off control of the switch 12, so that the coil current detected in terms of voltage generated at the resistor R1 will be kept at a constant level, which is smaller than the target current, or the peak current.

Once the switch 11 has been turned off, such constant current control of the switch 12 allows a constant current to flow from the power source line of the battery voltage VB to the coil 21a through the switch 12 and the diode D2, which constant current keeps the electromagnetic valve 21 in an open state.

In case the switch 11 or 12 has been turned off in the state where the switch 13 is turned on, flyback current is circulated from the side of the ground line to the coil 21a through the diode D3. Accordingly, current that passes through the coil 21a is the flyback current circulated through the diode D3 during the period from when the switch 11 is turned off to when the on/off control of the switch 12 is started, and during the period when the switch 12 is turned off in the on/off control of the switch 12.

When the driving period has elapsed, the control circuit 25 turns off the switch 13 and terminates the on/off control (i.e., constant current control) of the switch 12 to keep the switch 12 in an off-state. Thus, current supply to the coil 21a is stopped to close the electromagnetic valve 21. As a result, the fuel injection performed by the electromagnetic valve 21 is ended.

The flyback energy produced at the coil 21a when the switches 13 and 12 are turned off is recovered in the form of current from the downstream side of the coil 21a to the capacitor C1 through the diode D1 on the energy recovery path 22.

On the other hand, after turning off the switch 11 or 13, the control circuit 25 allows the DCDC converter 23 to resume charging the capacitor C1. This is for preparing for the subsequent driving of the electromagnetic valve. In the example shown in FIG. 13, while the switch 11 is turned on, the switch 12 is also turned on. Alternatively, the switch 12 may be adapted to turn off when the switch 11 is turned on. The configuration and operation of a fuel injection control apparatus of the type as described above are also described in detail in Japanese Patent Application Laid-Open No. 2001-015332, for example.

When the switch 11 is switched from an on-state to an off-state in the conventional fuel injection control apparatus 100 described above, current is supplied from the ground line side to the upstream-side terminal of the coil 21a through the diode D3.

Thus, when a forward-direction voltage at the diode D3 is "Vf", the voltage at the output terminal P1 in the state where the switch 11 is turned off drops at once from the charge voltage (substantially the target charge voltage Vc1) of the capacitor C1 to "−Vf" as shown in a broken-line square in FIG. 13, allowing a voltage variation ΔV per unit time to become very large. As a result, emission noise of an amount corresponding to the voltage variation may be caused to adversely effect reception conditions, for example, of radios.

One approach for suppressing the emission noise may, for example, be to reduce the electrical energy (i.e., voltage and current per se) fed to the coil 21a. Another approach may be to increase a slew rate of the switch 11 (i.e., to gradually bring the switch 11 into an off-state). The former approach however may deteriorate valve-opening responsiveness of the electromagnetic valve 21. The latter approach is also not practical because it may increase power loss of the switch 11, which may also increase the heat generation rate. Therefore, it has been desired that heat generation of elements be reduced as much as possible in on-vehicle apparatuses in particular, which are placed under high-temperature conditions.

SUMMARY OF THE INVENTION

The present invention has been made in light of the problem mentioned above and has as its object to provide an electromagnetic valve driving apparatus that can reduce emission noise, which is produced when a discharge switching element is in an off-state.

In order to solve the problem mentioned above, the electromagnetic valve driving apparatus of the present invention comprises: a discharging capacitor in which electrical energy is stored to perform discharge to a coil of an electromagnetic valve; charging means for charging the discharging capacitor by generating high voltage from power source voltage, the high voltage being higher than that of the power source voltage; discharge switching element, which is provided in series in a current path extending from the discharging capacitor to an upstream-side terminal of the coil and is turned on at the beginning of a driving period for supplying current to the coil to establish electrical connection between the discharging capacitor and the coil, so that current is discharged from the discharging capacitor to the coil, for bringing the electromagnetic valve into an operation state; controlling means for performing on/off control of the discharge switching element; circulating means, which is provided in the current path residing between a point closer to the coil than from the discharge switching element and a ground line, for circulation of current to the coil when the discharge switching element is turned off and discharge from the discharging capacitor to the coil is completed; and sub-discharging means, which is provided in the current path at a point closer to the coil than from the discharge switching element, for starting discharge to the coil when the discharge switching element is turned off, and for circulating current to the coil through the circulating means when the discharge to the coil is completed.

The electromagnetic valve driving apparatus of the present invention is so configured that the charging means produces voltage from the power source voltage, the voltage being higher than the power source voltage, and charges a discharging capacitor and that, through this charging, electrical energy to be discharged to a coil of an electromagnetic valve is stored in the discharging capacitor.

Further, the discharge switching element is provided in series in the current path extending from the discharging capacitor to the upstream-side terminal of the coil of the electromagnetic valve. The discharge switching element is turned on by the controlling means when the driving period for supplying current to the coil of the electromagnetic valve is started to establish an electrical connection to the discharging capacitor. As a result, current is discharged from the discharging capacitor to the coil, so that the electromagnetic valve can be promptly brought into an operating state.

The current path is also provided with the circulating means between a point closer to the coil than from the discharge switching element and a ground line. When the discharge switching element is turned off so that discharging to the coil from the discharging capacitor is finished, current is circulated to the coil through the circulating means. The current that passes through the coil via the circulating means is flyback current originating from the electrical energy accumulated in the coil.

Particularly, the electromagnetic valve driving apparatus of the present invention is provided with the sub-discharging means at a point in the current path, which point is closer to the coil than from the discharge switching element. The sub-discharging means is adapted to circulate current to the coil through the circulating means when discharging from the sub-discharging means to the coil is finished.

The electromagnetic valve driving apparatus of the present invention does not immediately stop discharging to the coil when the discharge switch is switched from an on-state to an off-state, but continues discharging to the coil with the aid of the sub-discharging means and, when the discharging of the sub-discharging means is finished, circulates current to the coil through the circulating means. Therefore, voltage variation (corresponding to the voltage variation at the output terminal P1 shown in FIGS. 12 and 13) at the upstream-side terminal of the coil can be mitigated when the discharge switch is switched from an on-state to an off-state.

DETAILED DESCRIPTION OF THE PREFERRED EMBODIMENTS

With reference to the accompanying drawings, hereinafter are described some embodiments to which a fuel injection control apparatus of the present invention is applied as an electromagnetic valve driving apparatus.

Figure 12:
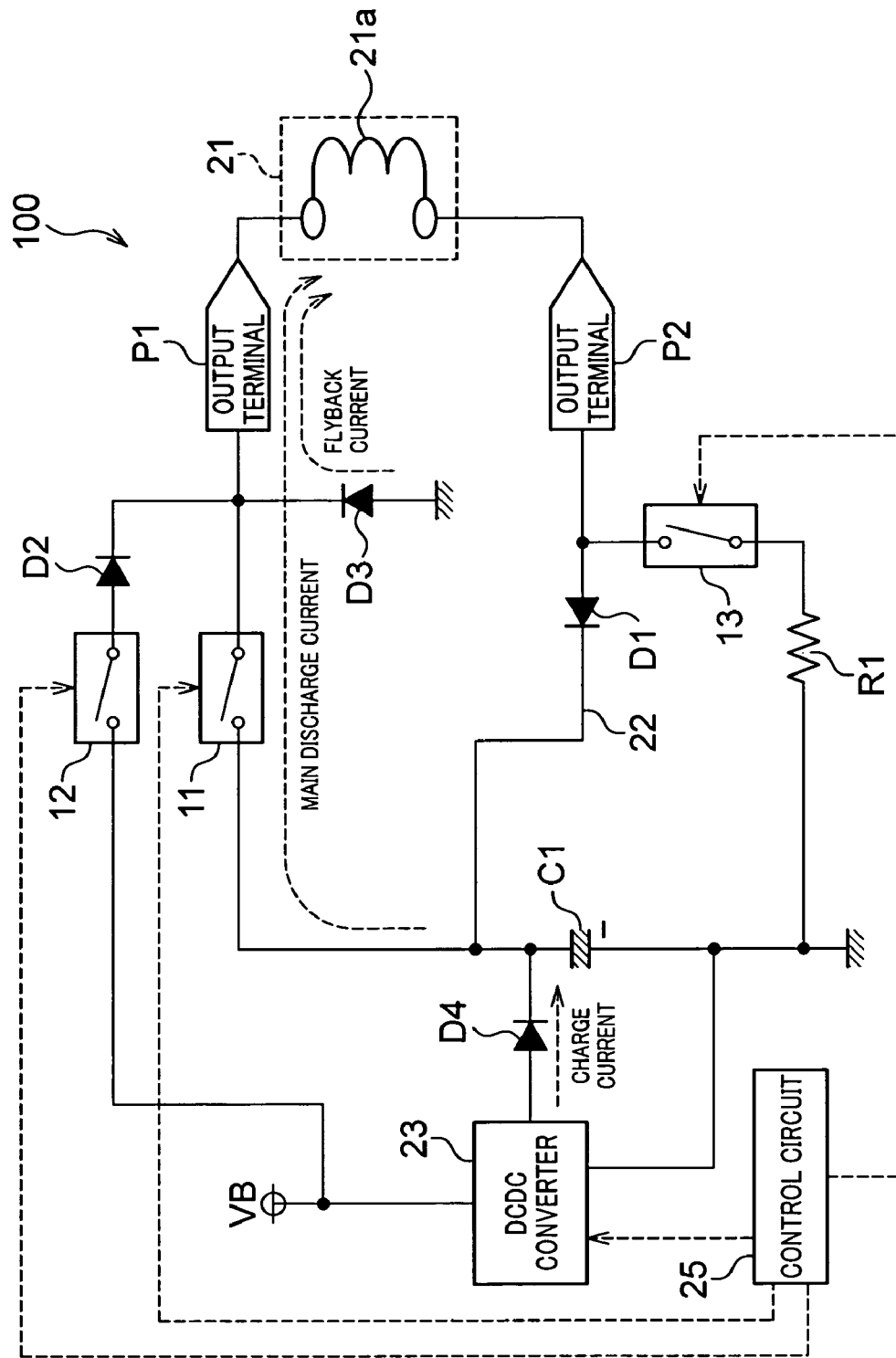
FIG. 12 is a block diagram illustrating a conventional fuel injection control apparatus.
Figure 13:
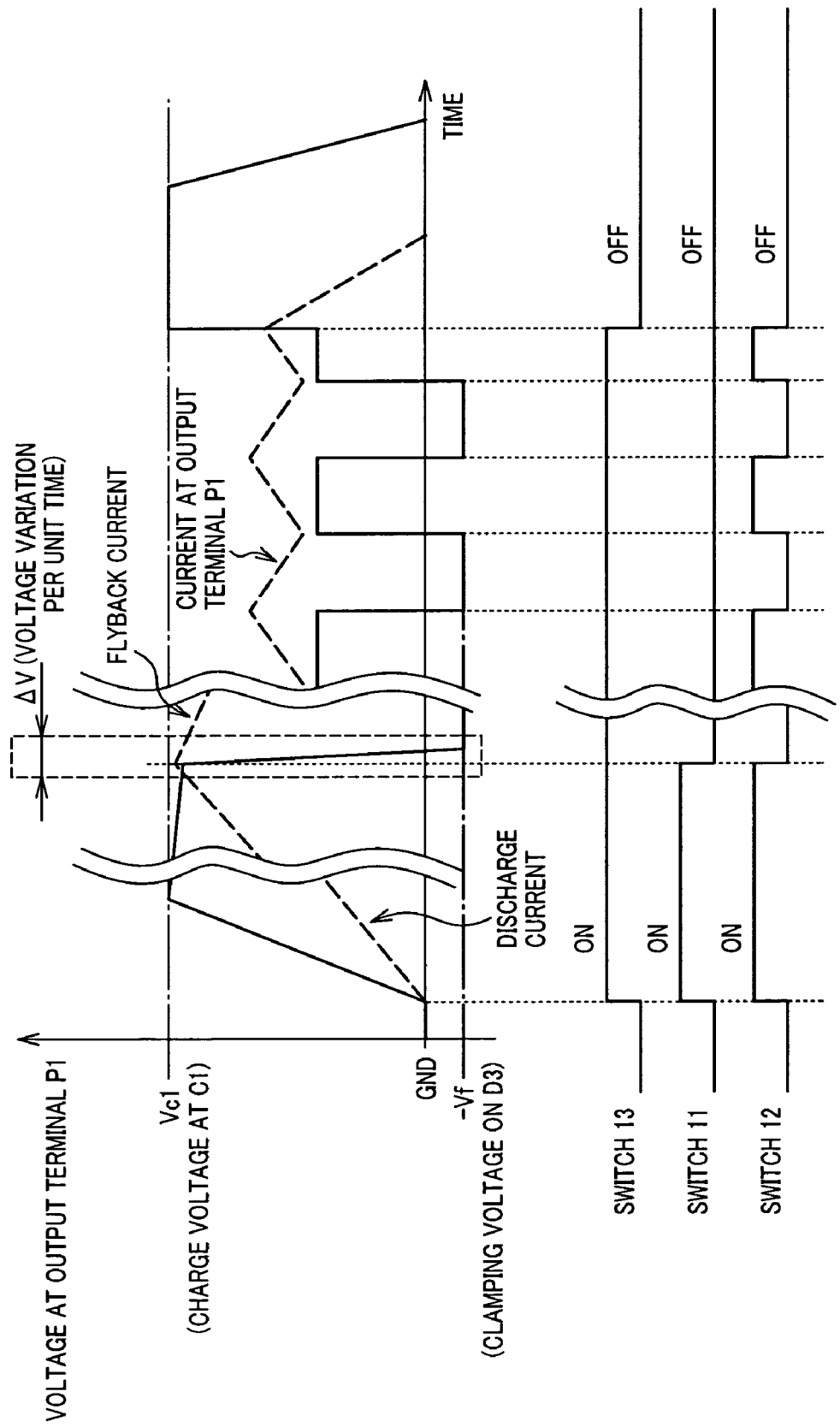
FIG. 13 is a timing diagram illustrating the operation and a problem of the conventional apparatus.

Similar to the fuel injection control apparatus 100 shown in FIG. 12, the fuel injection control apparatus of the following embodiments are purposed to drive electromagnetic valves (i.e. electromagnetic solenoid type unit injectors) for injecting and supplying fuel to the cylinders of a multi-cylinder diesel engine for vehicles. Each of the electromagnetic valves is opened and inject high-pressure fuel pressurized and stored in a known common rail. The drawings for each of the following embodiments provide illustration of only one of the electromagnetic valves of the respective cylinders. The following description is focused on the driving of the single electromagnetic valve drawn in each figure. In the drawings related to the following embodiments, identical or similar components to those shown in FIG. 12 are given the same reference numerals for the sake of omitting explanation. The following description only describes differences from the fuel injection control apparatus 100 shown in FIG. 12. Further, in the following embodiments of the present invention, a switching element is referred to as a "switch" and an MOSFET (metal oxide semiconductor field effect transistor) is used as the switch. In the following embodiments of the present invention, discharge from the capacitor C1 to the coil 21a is referred to as "main discharge" and discharge from capacitors other than the capacitor C1 to the coil 21a is referred to as "sub-discharge".

First Embodiment

Figure 1:
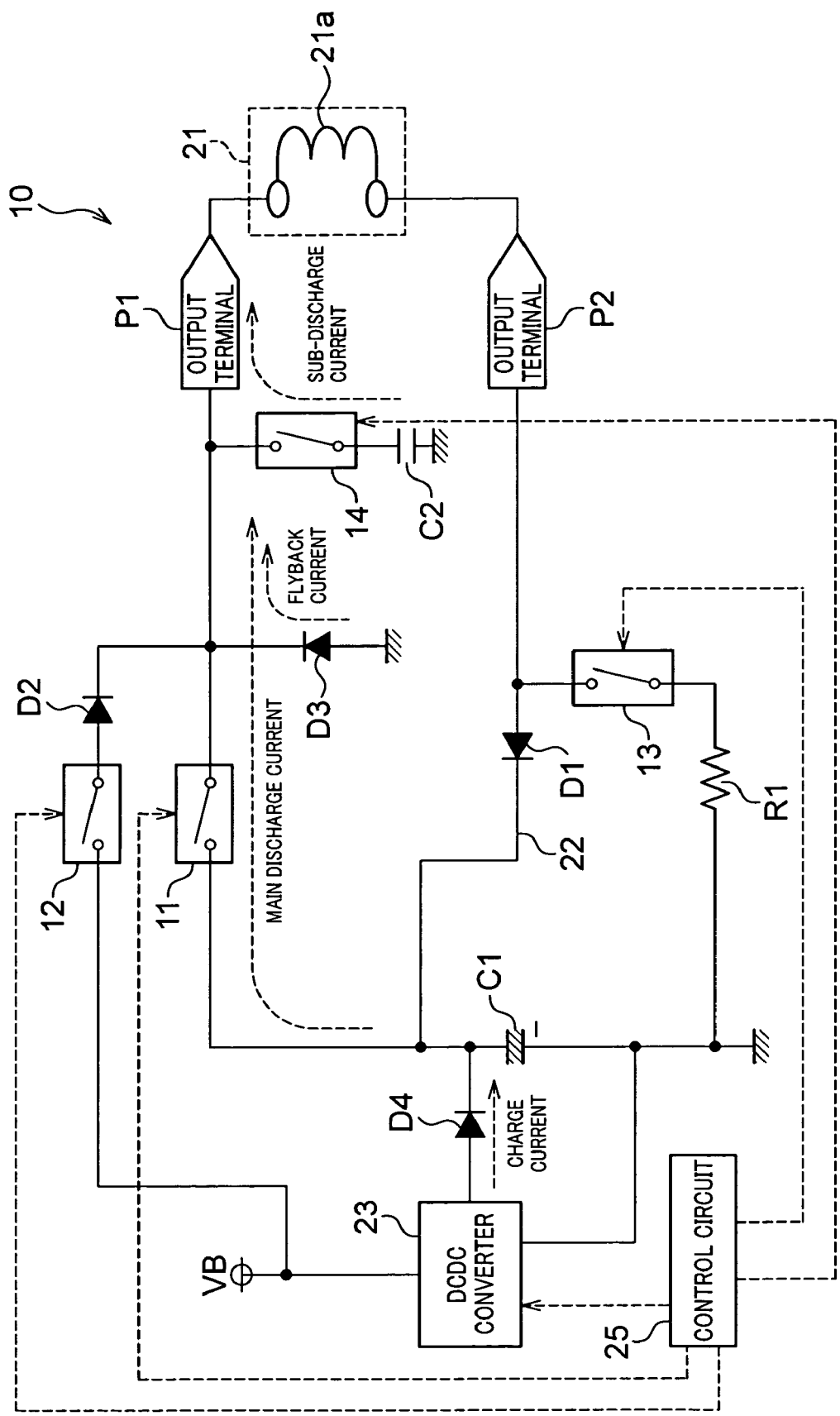
FIG. 1 is a block diagram of a fuel injection control apparatus according to a first embodiment of the present invention.

As shown in FIG. 1, a fuel injection control apparatus 10 according to a first embodiment is different from the fuel injection control apparatus 100 shown in FIG. 12 in the points as provided at the following items (1-1) and (1-2).

(1-1) A series circuit consisting of a capacitor C2 and a switch 14 is additionally provided in parallel with the diode D3 in order to perform the sub-discharge subsequent to the main discharge. The capacitor C2 is adapted to establish an electrical connection between the output terminal P1 (or wiring connecting between the switch 11 and the output terminal P1) and the ground line when the switch 14 is turned on. The switch 14 is also controlled by the control circuit 25.

The capacitor C1 is an aluminium electrolytic capacitor or a film capacitor, while the capacitor C2 is of the type having smaller equivalent series inductance (ESL) and higher discharging speed than the capacitor C1 (stacked ceramic capacitor in the present embodiment).

Figure 2:
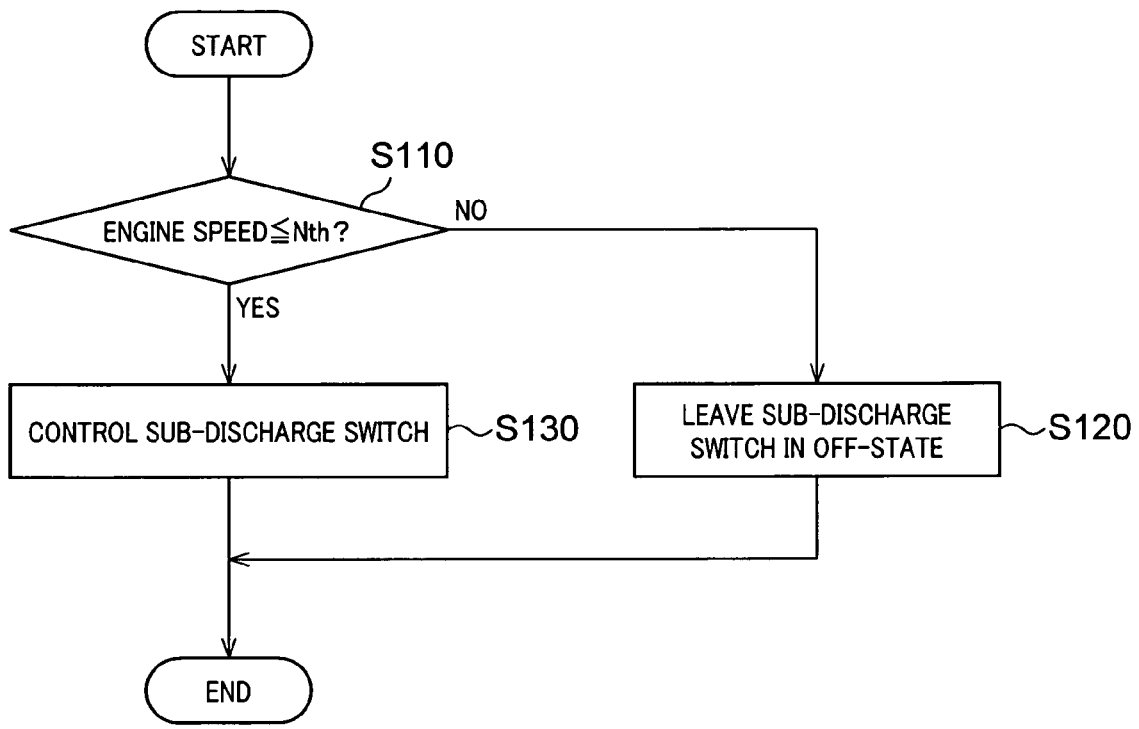
FIG. 2 is a flow diagram illustrating a procedure of the control performed by a control circuit over a sub-discharge switch.

(1-2) As shown in FIG. 2, the control circuit 25 determines whether or not the engine speed is equal to or less than a preset value Nth (step S110). When the engine speed is not equal to or less than the preset value Nth (NO at step S110), a sub-discharge switch 14 is left in an off-state (step S120), but when the engine speed is equal to or less than the preset value Nth (YES at step S110), the switch 14 is controlled as shown in FIGS. 3B and 4 (step S130).

In other words, the control circuit 25 turns on the switch 14 simultaneously with the switch 11, and turns off the switch 14 after a predetermined period from when the switch 11 has been turned off, has lapsed.

Therefore, when the switch 11 is turned on in the state where the engine speed is equal to or less than the preset value Nth, a portion of the energy discharged from the capacitor C1 is charged to the sub-discharging capacitor C2. When the switch 11 is turned off, discharge (sub-discharge) from the capacitor C2 to the coil 21a is started as shown within the dashed-dotted line ellipses shown in FIGS. 3B and 4. Then, the voltage of the output terminal P1 begins gradually decreasing with the decrease in the amount of charges in the capacitor C2. When the discharge from the capacitor C2 to the coil 21a is finished, flyback current is circulated to the coil 21a through the diode D3.

Figure 3:
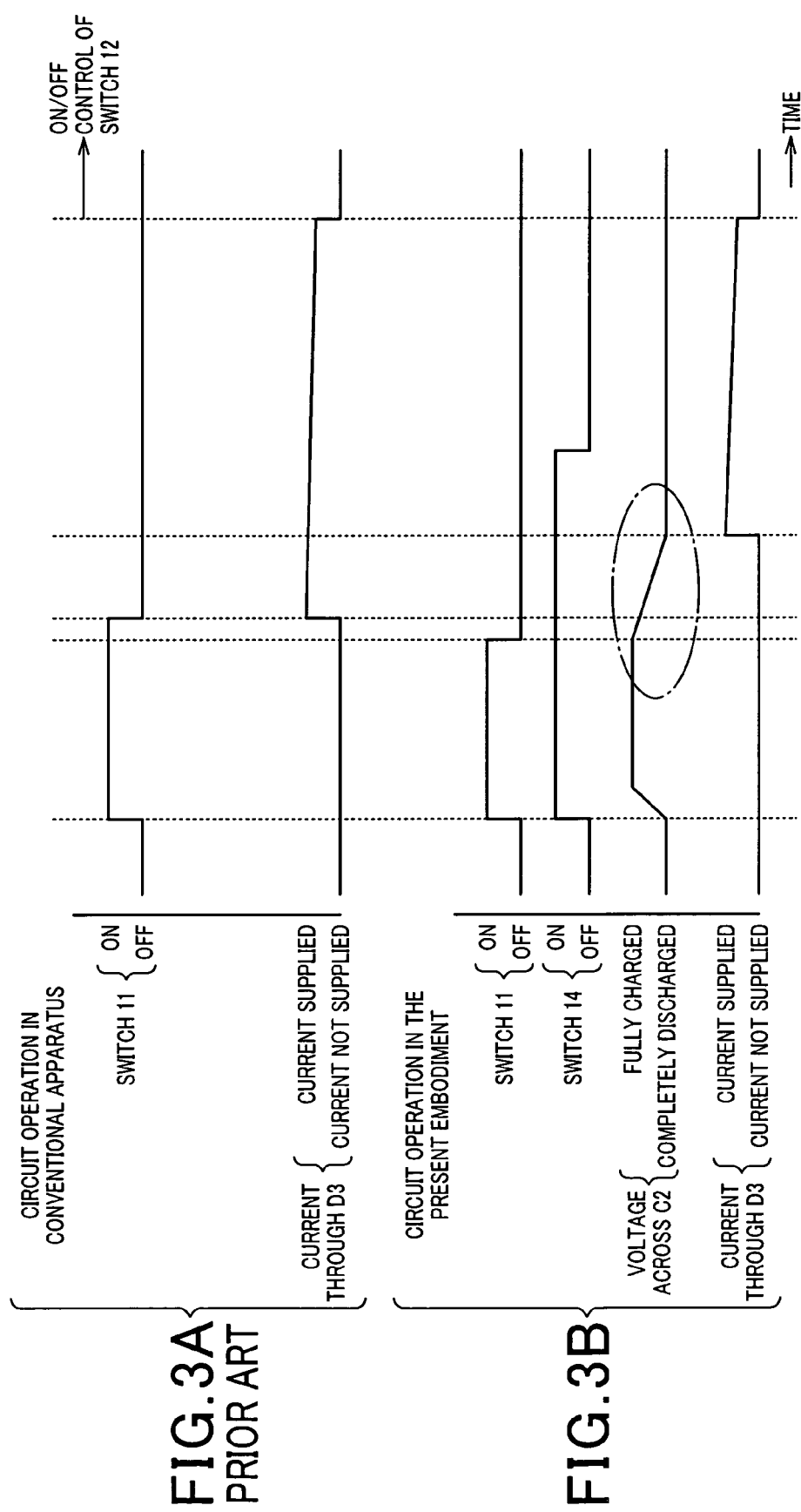
FIGS. 3A and 3B are timing diagrams illustrating the operation and effects of the first embodiment.
Figure 4:
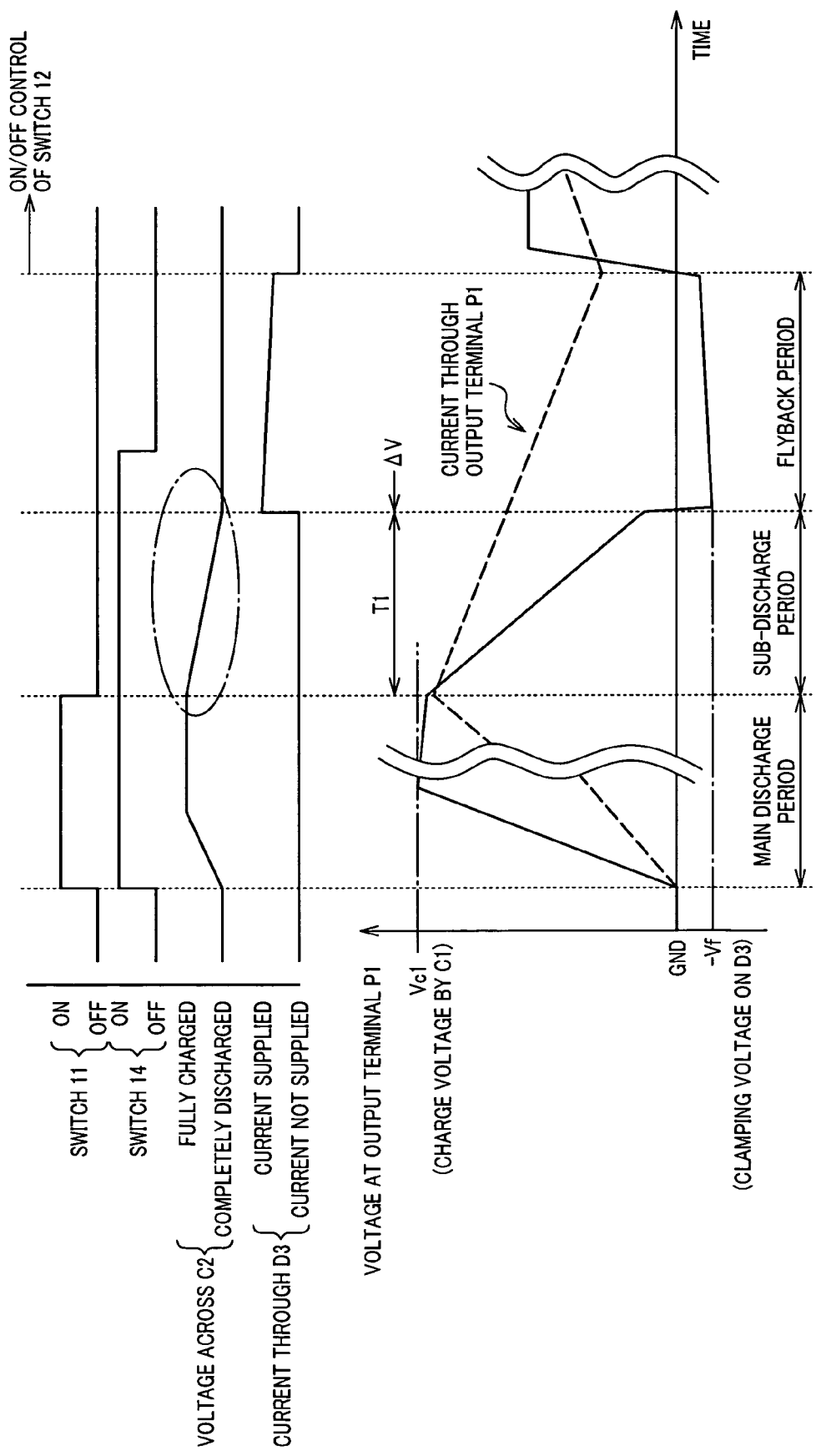
FIG. 4 is a timing diagram illustrating the operation and effects of the first embodiment.

Specifically, the conventional apparatus 100 has been configured, as shown in FIG. 3A, to circulate flyback current to the coil 21a through the diode D3 simultaneously with turning off the switch 11. The present embodiment, however, is configured, as shown in FIGS. 3B and 4, to start sub-discharge to the coil 21a from the capacitor C2 simultaneously with the turning-off of the switch 11 for completion of the main discharge to the coil 21a from the capacitor C1, and to circulate flyback current to the coil 21a through the diode D3 when the sub-discharge from the capacitor 2 is completed.

The predetermined period from the turning-off of the switch 11 to the turning-off of the switch 14 is set so as to last longer than the time which is considered to be required for completing the discharge from the capacitor C2 to the coil 21a. Further, when an amount of energy to be fed to the coil 21a at the beginning of the driving period is Pinj, and an amount of energy to be fed to the coil 21a from the capacitor C2 is Pc2, the timing for turning off the switch 11 (i.e. the point of expiration of the on-state period of switch 11) in performing sub-discharge, is set at a time point which may enable feeding of energy from the capacitor C1 to the coil 21a by a certain amount. The certain amount is obtained by subtracting the energy Pc2 from the energy Pinj (=Pinj−Pc2). At the bottom line of FIG. 4, the "main discharge period" refers to a period when current is discharged from the capacitor C1 to the coil 21a, the "sub-discharge period" refers to a period when current is discharged from the capacitor C2 to the coil 21a, and the "flyback period" refers to a period when flyback current is circulated to the coil 21a through the diode D3.

As described above, the fuel injection control apparatus 10 according to the first embodiment carries out sub-discharge from the capacitor C2 to the coil 21a instead of immediately stopping discharge to the coil 21a upon changing the switch 11 from an on-state to an off-state, under the conditions where the engine speed is equal to or less than the preset value Nth, e.g. at low engine speed that may tend to cause annoying noise on the radio. Then, after completing the sub-discharge, the flyback current will come to be circulated to the coil 21a through the diode D3.

As a result, as shown in FIG. 4, when the switch 11 is turned off, the voltage of the output terminal P1 decreases to the level "−Vf" spending longer time T1 than in the conventional apparatus 100, mitigating the voltage variation at the output terminal P1 (voltage variation at the upstream-side of the coil) when the switch 11 is turned off. Thus, the emission noise due to the voltage variation when turning off the switch 11 can be reliably reduced without causing energy loss, such as deterioration in heat generation.

On the other hand, when the engine speed is not equal to or less than the preset value Nth (i.e. is more than the preset value Nth), the capacitor C2 is disabled (step S120) and no sub-discharge is performed. Thus, the factors for varying energy supply to the coil 21a become equal to those of the conventional apparatus 100. Specifically, the accuracy in the valve-opening timing of the electromagnetic valve 21 (and thus the accuracy in the fuel injection) will not be deteriorated worse than in the conventional apparatus 100. More specifically, when the noise on the radio due to the operation sound of the engine is not annoying, the accuracy in the fuel injection is put ahead of the reduction in the emission noise.

Figure 5:
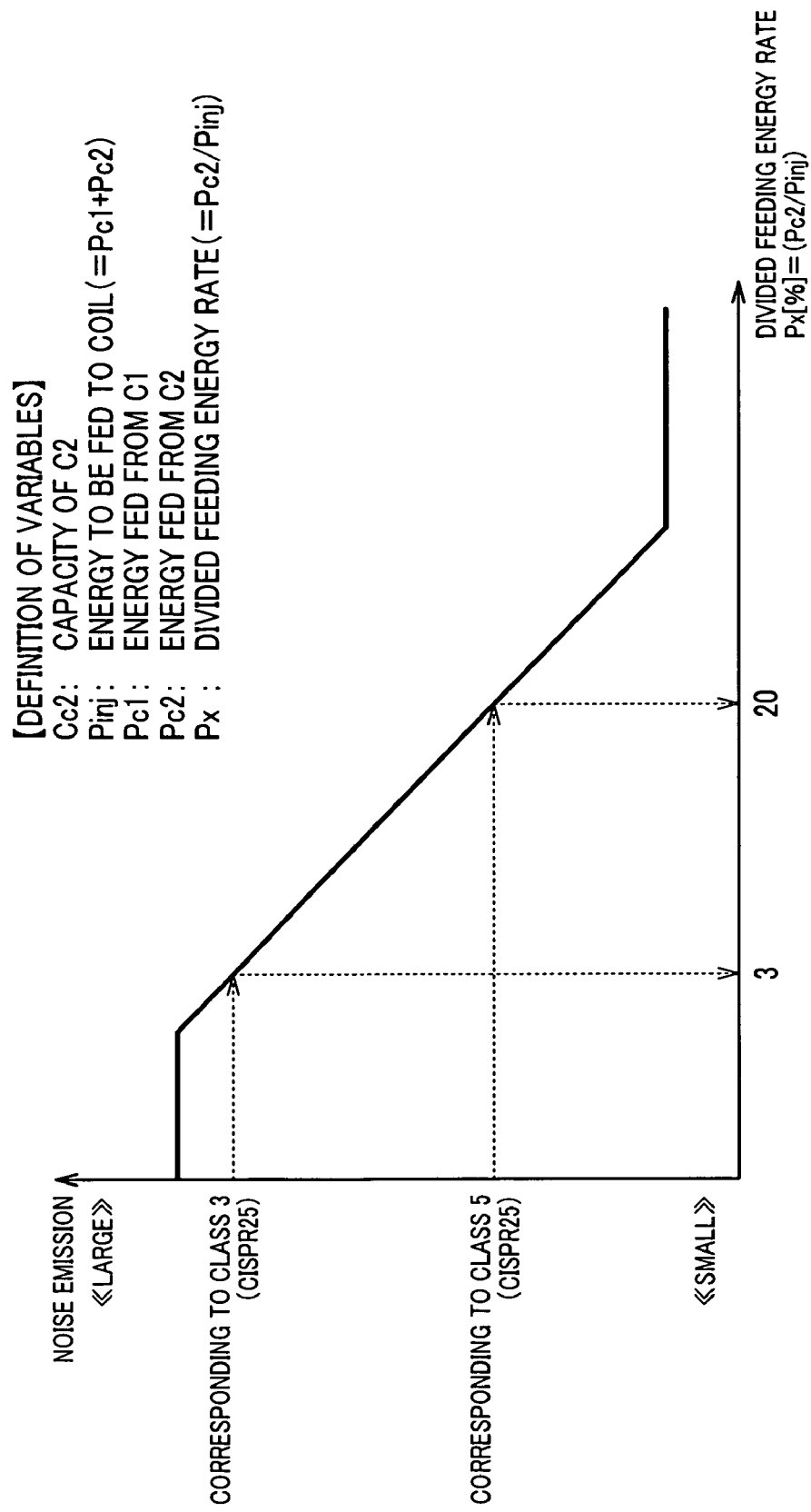
FIG. 5 is a graph showing a relation between a divided feeding energy rate Px and an emission noise.

Assuming a ratio of the energy Pc2 to the energy Pinj (=Pc2/Pinj) to be a divided feeding energy rate Px, the relation between the rate Px and noise emission was confirmed, through experiments, to result as shown in FIG. 5.

If a target noise emission is Class 3 in standard CISPR 25 of CISPR (Comité International Special des Perturbations Radioélectriques), the rate Px may be set at 3% as can be seen from FIG. 5.

In this regard, the present embodiment sets a capacity Cc2 for the capacitor C2 so that the rate Px will be 3% or more.

In particular, the following Formulas (i) and (ii) are established first:

$$Pc2 = Pinj \times Px, \quad Pinj = Pc1 + Pc2 \quad (i)$$

where "Pc1" is an amount of energy fed from the capacitor C1 to the coil 21a $$Pc2 = (1/2) \times Cc2 \times Vc1^2 \quad (ii)$$

where "^n" is an n-th power (n is an integer).

Further, the following Formula (iii) can be derived from Formulas (i) and (ii):

$$Cc2 = [2 \times (Px \times Pinj)]/Vc1^2 \quad (iii)$$

In this connection, in the present embodiment, the target charge voltage Vc1 of the capacitor C1 resulting from the DCDC converter 23 is 50 (V) and the energy Pinj is 50 (mJ).

Accordingly, the following relation can be derived from Formula (iii):

$$Cc2 = [2 \times (0.03 \times 50 \times 10^{-3})]/50^2 = 1.2 \; (\mu F)$$

Thus, the capacity Cc2 may be set at 1.2 (μF) or more.

As can be seen from the above, setting the capacity Cc2 of the capacitor C2 at least at 1.2 (μF), which is comparatively a small capacity, may achieve the noise performance comparable to Class 3 or more in standard CISPR 25.

In the present embodiment, the capacitor C1 corresponds to the discharging capacitor, the DCDC converter 23 corresponds to the discharging means, the switch 11 corresponds to the discharge switching element, the diode D3 corresponds to the circulating means, and the capacitor C2 and the switch 14 correspond to the sub-discharging means. Also, the switch 14 corresponds to a connection switching element.

The first embodiment described above may be modified as provided at the following items (1) to (4).

(1) The control circuit 25 may leave the switch 14 turned on at step S130 of FIG. 2.

(2) The capacitor C2 may be parallelly connected to the diode D3 without providing the switch 14. This configuration may necessarily enable sub-discharge of current from the capacitor C2 to the coil 21a every time the switch 11 is changed from an on-state to an off-state, irrespective of the engine speed or the like. Also, this configuration can minimize the number of elements provided for performing sub-discharge.

(3) An end portion of the capacitor C2 opposite to the output terminal P1 may only be connected to a potential lower than the target voltage Vc1. Accordingly, this end portion can alternatively be connected, for example, to the power source line of the battery voltage VB, not necessarily to the ground line.

Figure 6:
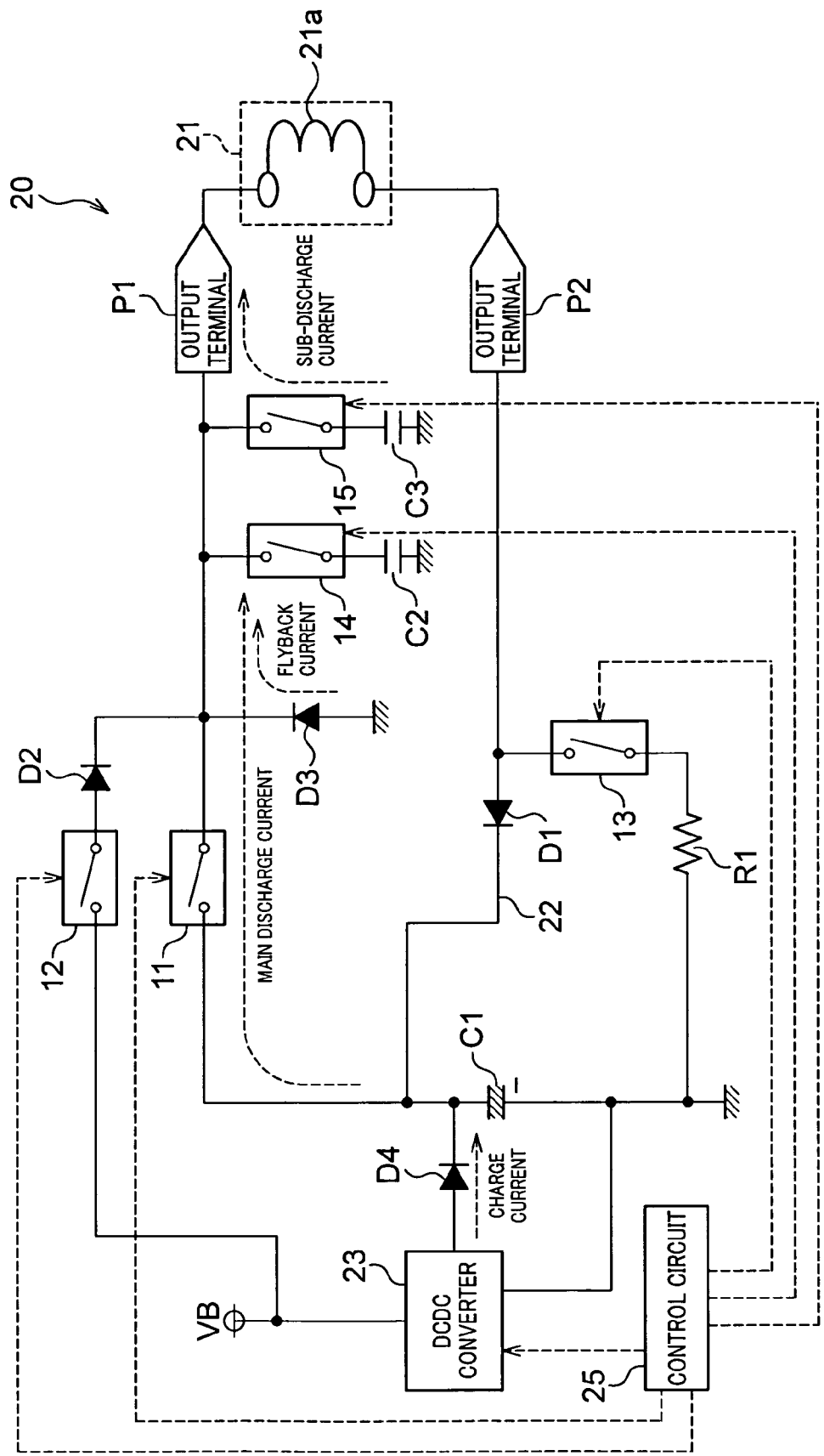
FIG. 6 is a block diagram illustrating a modification of the first embodiment.

(4) As shown in FIG. 6, a circuit similar to the series circuit of the capacitor C2 and the switch 14 may be provided in plural number. A fuel injection control apparatus 20 shown in FIG. 6 is additionally provided with a series circuit consisting of a capacitor C3 and a switch 15.

The configuration shown in FIG. 6 can vary the total capacitance for performing sub-discharge depending on whether both of or either one of the switches 14 and 15 are/is turned on. Thus, depending on the desired degree of reduction in the emission noise generated when the switch 11 is turned off, the total capacitance for sub-discharge can be actively varied.

For example, control can be effected in such a way that; if the engine speed is equal to or less than a first preset value Nth1, both of the switches 14 and 15 are turned on/off in the manner shown in FIGS. 3B and 4 or left turned on; if the engine speed is larger than the first preset value Nth1 and equal to or less than a second preset value Nth2, the either one of the switches 14 and 15 is turned on/off in the manner shown in FIGS. 3B and 4 or left turned on; and if the engine speed is larger than the second preset value Nth2, both of the switches 14 and 15 are left turned off.

Second Embodiment

Figure 7:
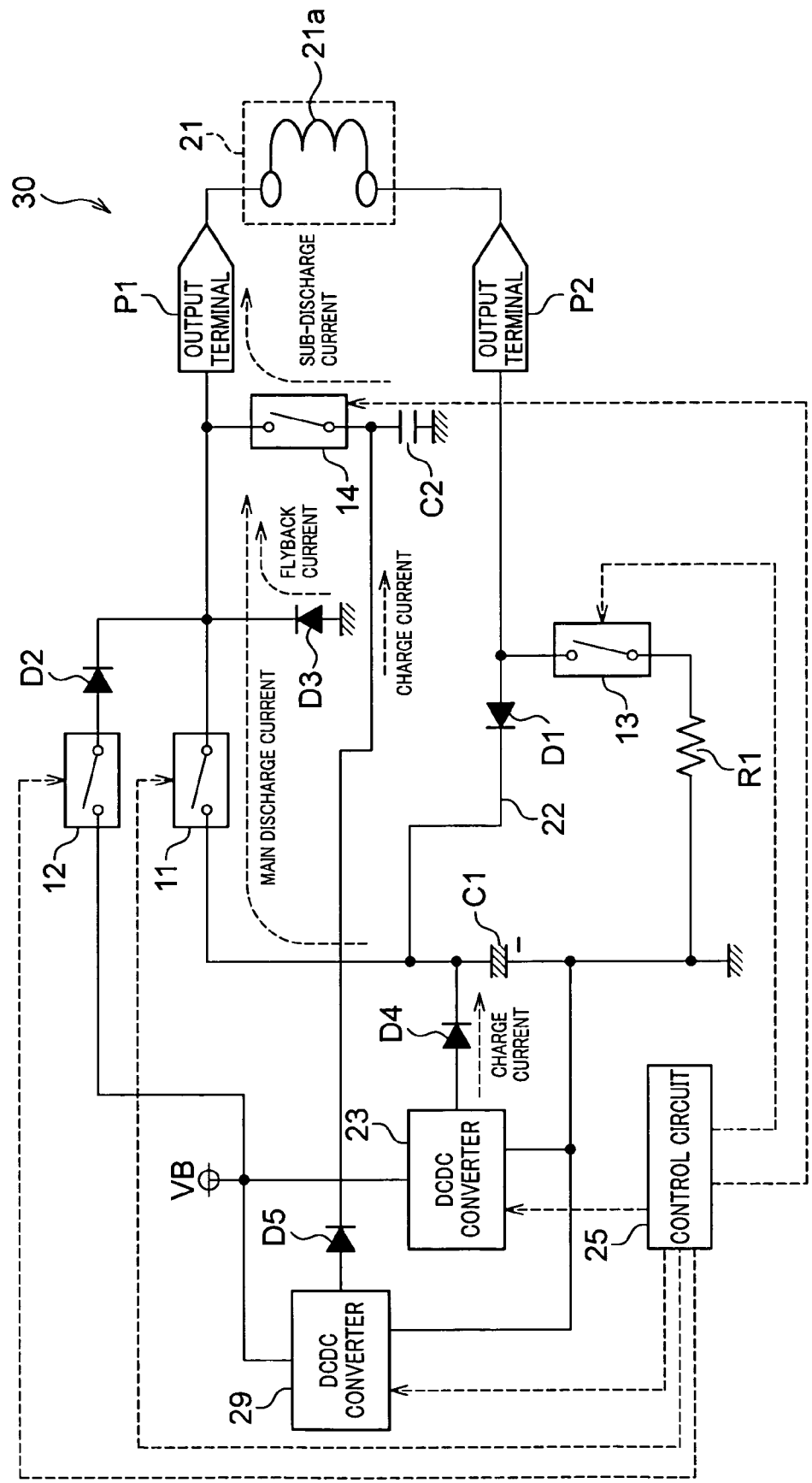
FIG. 7 is a block diagram illustrating a fuel injection control apparatus according to a second embodiment of the present invention.

As shown in FIG. 7, a fuel injection control apparatus 30 according to a second embodiment is different from the fuel injection control apparatus 10 according to the first embodiment in the points provided at the following items (2-1) and (2-2).

It should be appreciated that, in the second and the subsequent embodiments, the identical or similar components to those in the first embodiment are given the same reference numerals for the sake of simplifying or omitting the explanation.

(2-1) A DCDC converter 29 similar to the DCDC converter 23 is additionally provided. The DCDC converter 29 generates voltage higher than the battery voltage VB, and this high voltage is provided to the capacitor C2 through a diode D5 so that the capacitor C2 can be charged. The DCDC converter 29 is controlled by the control circuit 25.

Figure 8:
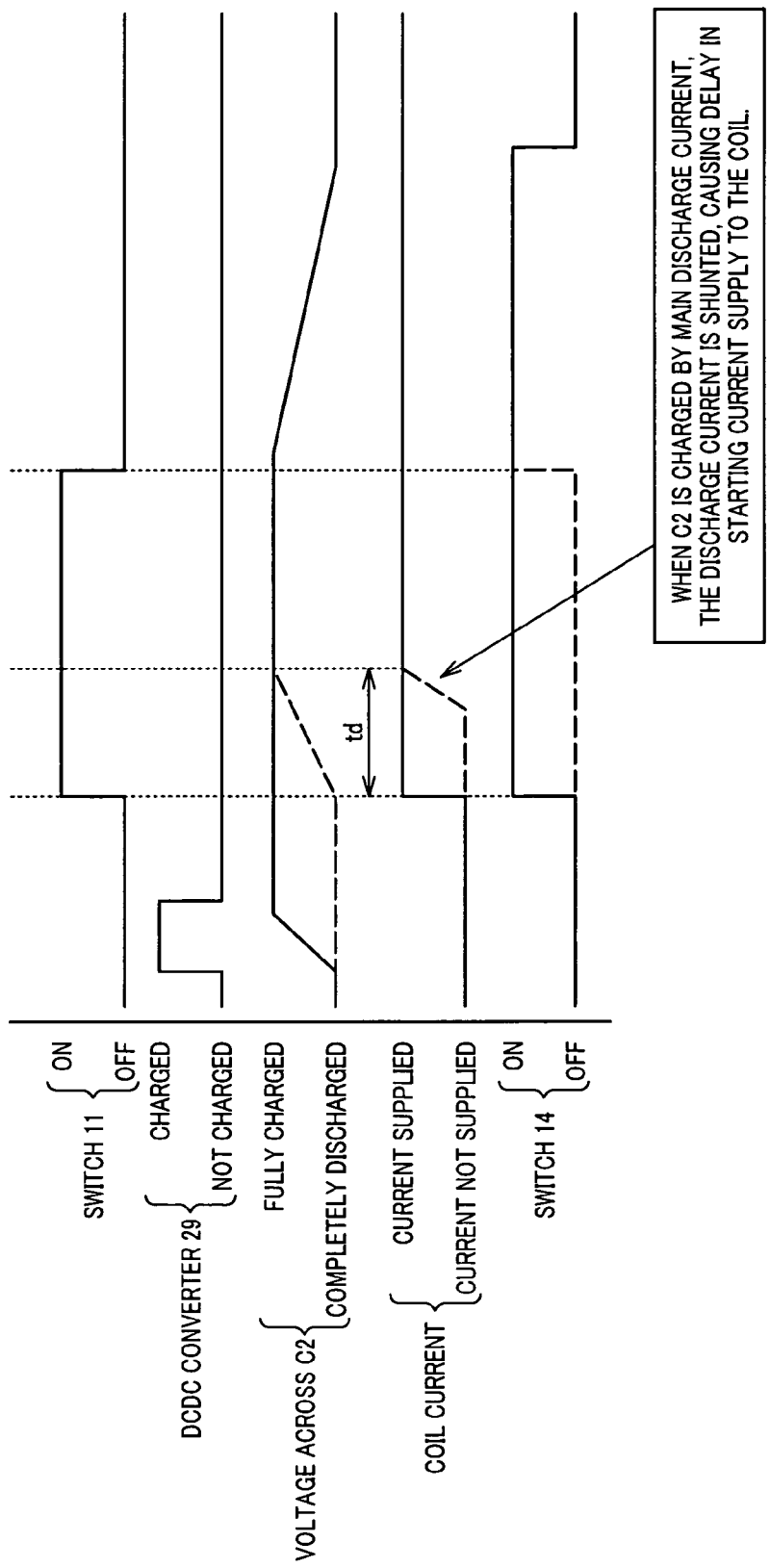
FIG. 8 is a timing diagram illustrating the operation and effects of the second embodiment.

(2-2) As shown in FIG. 8, when executing sub-discharge, the control circuit 25 operates the DCDC converter 29 while turning off the switches 11 and 14, so that the capacitor C2 can be charged until the charge voltage of the capacitor C2 reaches a target voltage Vc2. It should be appreciated that, in the present embodiment, Vc2=Vc1.

As will be understood from the above, the capacitor C2 of the present invention is charged by the DCDC converter 29 instead of the capacitor C1. Thus, the switch 14 does not necessarily have to be turned on simultaneously with the turn-off of the switch 11. As shown by a broken line at the bottom of FIG. 8, the switch 14 may by turned on when the switch 11 has been turned off or during a period when the switch 11 is turned on up until when it is turned off.

The second embodiment as described above charges the capacitor C2 with the aid of the DCDC converter 29. Thus, substantially all the energy discharged from the capacitor C1 can be supplied to the coil 21a.

This can permit abrupt discharge to the coil 21a at the time when the switch 11 is turned on, leading to the reduction in the time of operational response (hereinafter referred to as "operational response time") in bringing the electromagnetic valve 21 into an on-state from when the switch 11 has been turned on.

Specifically, as shown by the broken lines at the third and fourth lines from the top in FIG. 8, the first embodiment has partially spent the energy discharged from the capacitor C1 to charge the capacitor C2. As a result, starting current supply to the coil has been slightly delayed, and thus by that much, the operational response time of the electromagnetic valve 21 has been be elongated. In contrast, the configuration of the second embodiment can prevent this from happening.

It should be appreciated that the DCDC converter 29 of the second embodiment corresponds to the sub-discharge charging means. The target voltages Vc2 and Vc1 may be different from each other. Also, the modifications (3) and (4) provided above is applicable to the second embodiment.

Third Embodiment

Figure 9:
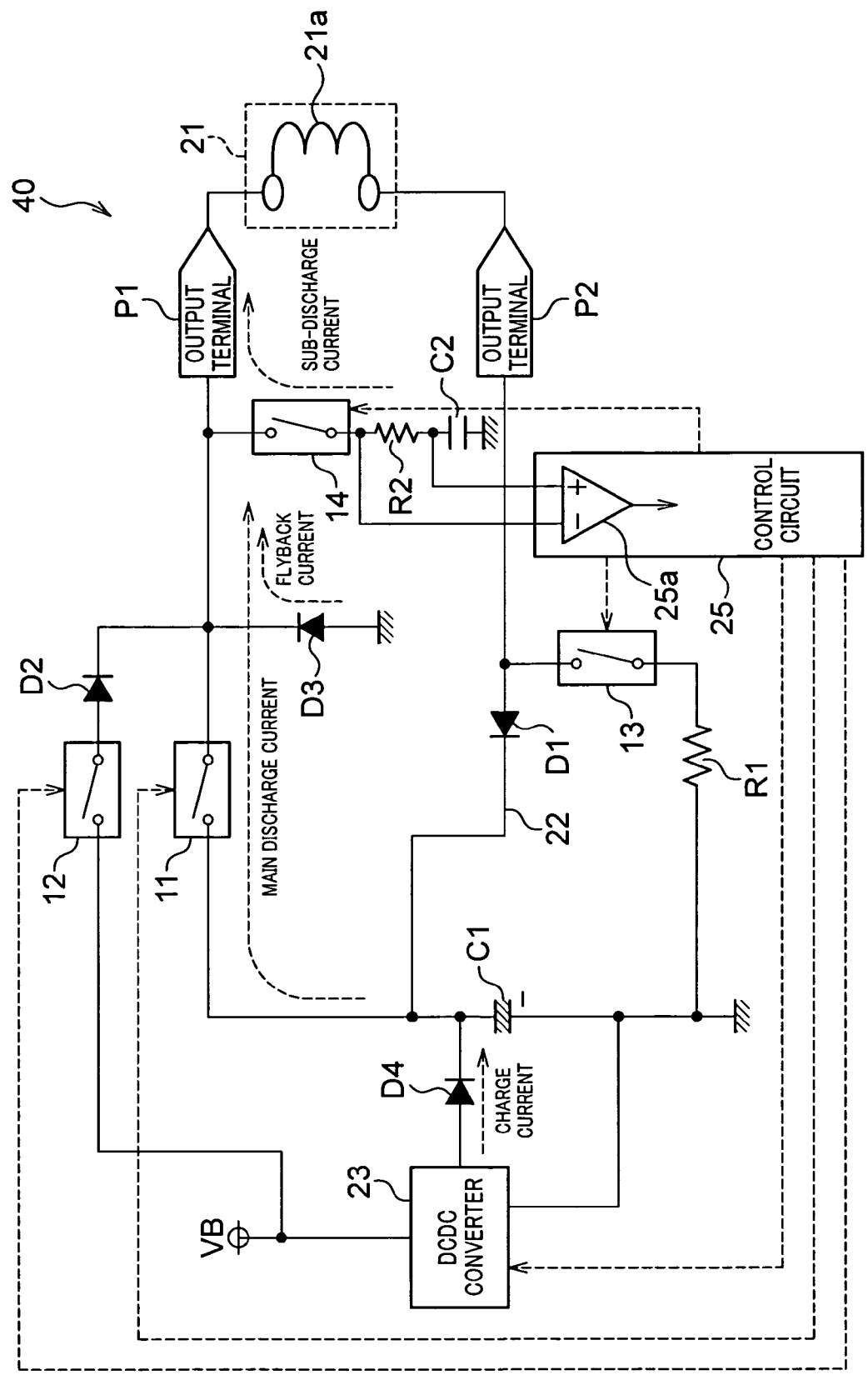
FIG. 9 is a block diagram illustrating a fuel injection control apparatus according to a third embodiment of the present invention.

As shown in FIG. 9, a fuel injection control apparatus 40 according to a third embodiment is different from the fuel injection control apparatus 10 according to the first embodiment in the points as provided at the following items (3-1) and (3-2).

(3-1) A resistor R2 is connected in series with the capacitor C2, for detecting current discharged to the coil 21a from the capacitor C2.

(3-2) The voltage across the resistor R2 is amplified by an amplifier 25a in the control circuit 25.

In performing sub-discharge, the control circuit 25 monitors the output of the amplifier 25a every time the switch 11 is changed from an on-state to an off-state, so as to determine whether or not current is discharged from the capacitor C2 to the coil 21a. At the same time, the control circuit 25 measures duration of a period, which has been determined as being used for performing discharge, as a period of discharge from the capacitor C2 to the coil 21a. Further, upon determining the discharge from the capacitor C2 as being completed, the control circuit 25 stores the currently measured discharge period into a memory (not shown). Then, in subsequently performing sub-discharge, the control circuit 25 adjusts the timing for turning off the switch 11 in the on/off control of the switch 11, based on the discharge periods that have been measured up to then.

In particular, every time measurement of the discharge period is finished, the control circuit 25 calculates and stores in the memory the latest average of an M number of discharge periods (M is an integer equal to or more that 2) including the current measurement. When the switch 11 is turned on/off the next time, the timing for turning off the switch 11 is adjusted based on the stored average discharge period.

Figure 10:
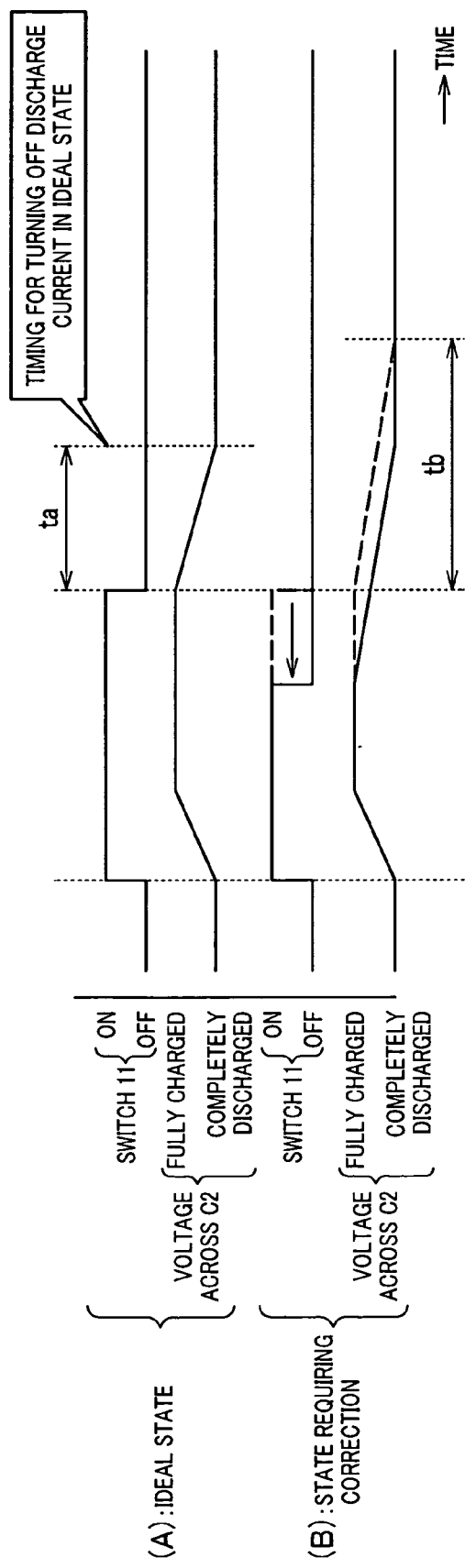
FIG. 10 is a timing diagram illustrating the operation and effects of the third embodiment.

For example, variation of slight increase in the capacitance of the capacitor C2 due to the variation in manufacture, elapsed time, temperature or the like, may elongate the discharge period of the capacitor C2, while increasing the energy fed from the capacitor C2 to the coil 21a. In this regard, as exemplified in FIG. 10, when an average tb of measured discharge periods is longer than a reference ta in an ideal state, the timing for turning off the switch 11 is put ahead by the time corresponding to the difference, so that the energy fed from the capacitor C1 to the coil 21a will be reduced. Contrarily, when the average tb of the measured discharge periods is shorter than the reference ta in an ideal state, the timing for turning off the switch 11 is delayed by the time corresponding to the difference, so that the energy fed from the capacitor C1 to the coil 21a will be increased. In this way, the total energy fed to the coil 21a is kept constant.

According to the third embodiment described above, the total energy fed to the coil 21a from both of the capacitors C2 and C1 can be steadied irrespective of variation in manufacture, elapsed time, temperature or the like, and thus high accuracy in the fuel injection can be ensured.

It should be appreciated that, in the third embodiment, the control circuit 25 corresponds to the controlling means.

On the other hand, for example, instead of obtaining an average of measured discharge periods, it may be so configured that the timing for turning off the switch 11 is adjusted only based on the previous discharge period.

Also, instead of measuring a discharge period at every fuel injection, a discharge period may be measured, for example, once in a plurality of fuel injections, or only at an initial injection or at a plurality of injections since the fuel injection control apparatus 40 has been started.

Further, an arrangement may be so made that the measured discharge periods or an average thereof are stored in a non-volatile memory or a backup RAM (RAM whose power source is backed up) as learned values and that the learned values may be used the next time the fuel injection control apparatus 40 is started for fuel injection.

The modifications provided at items (1) to (4) are also applicable to the third embodiment.

Fourth Embodiment

Figure 11:
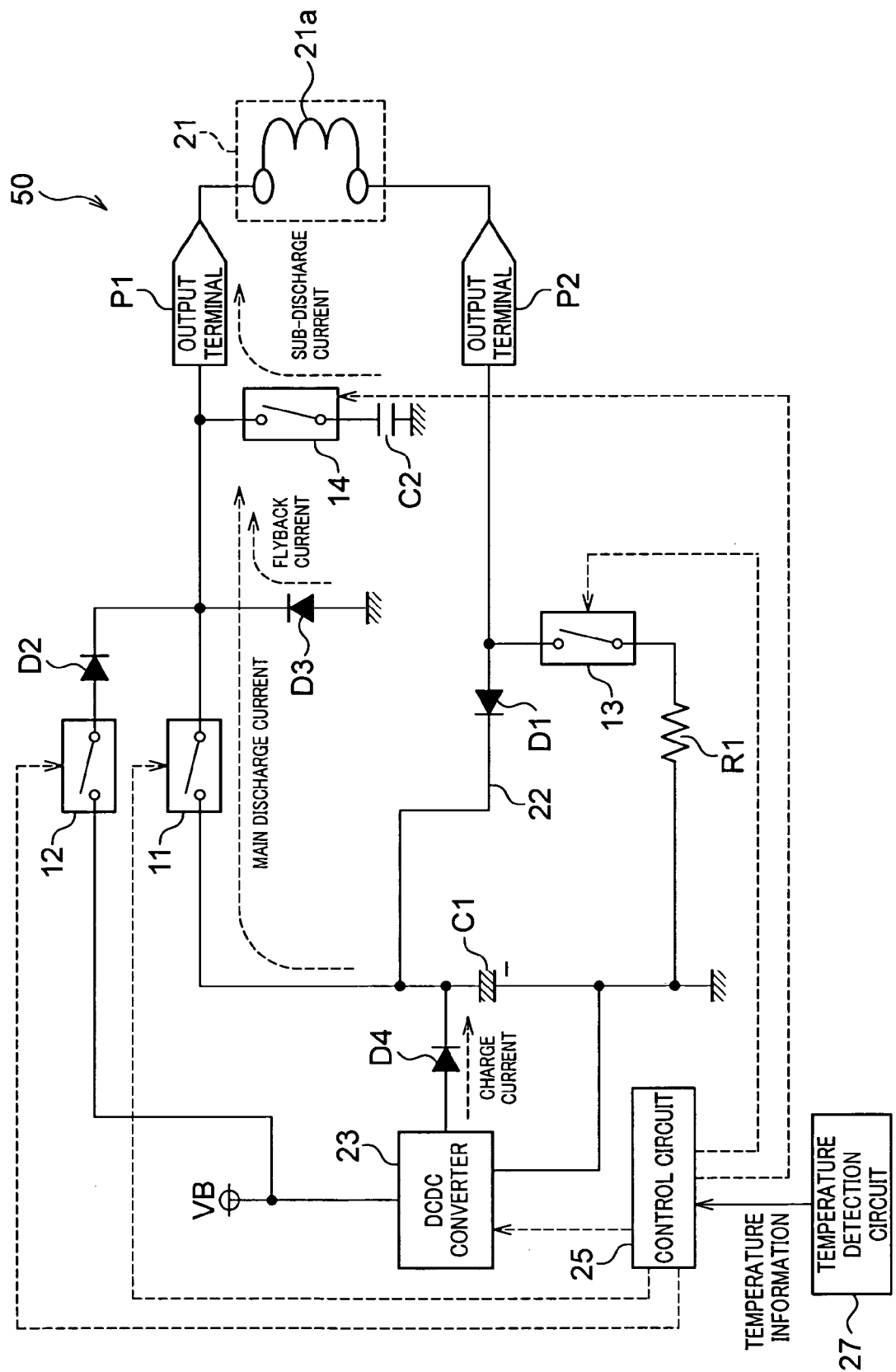
FIG. 11 is a block diagram illustrating a fuel injection control apparatus according to a fourth embodiment of the present invention.

As shown in FIG. 11, a fuel injection control apparatus 50 according to the fourth embodiment is different from the fuel injection control apparatus 10 according to the first embodiment in the points as provided at the following items (4-1) and (4-2).

(4-1) A temperature detection circuit 27 is provided for detecting temperature in the fuel injection control apparatus 50. The temperature detection circuit 27 is a known circuit which includes a temperature detection diode, for example, and utilizes that forward voltage of the temperature detection diode changes with the change of temperature. The temperature detection circuit 27 amplifies the forward voltage of the temperature detection diode and outputs the voltage as temperature information.

(4-2) In performing sub-discharge, the control circuit 25 adjusts the timing for turning off the switch 11 based on the temperature information derived from the temperature detection circuit 27 in the on/off control of the switch 11.

For example, in case the capacitor C2 is of the type whose capacitance increases as the temperature becomes higher, the higher the temperature is, the larger the energy becomes, which is fed to the coil 21a from the capacitor C2. Thus, the control circuit 25 puts ahead the timing for turning off the switch 11 as the temperature obtained from the temperature information of the temperature detecting circuit 27 becomes higher, so that the total energy fed to the coil 21a can be kept constant. Contrarily, in case the capacitor C2 is of the type whose capacitance increases as the temperature becomes lower, the control circuit 25 puts ahead the timing for turning off the switch 11 as the temperature obtained from the temperature information of the temperature detecting circuit 27 becomes lower, so that the total energy fed to the coil 21a can be kept constant.

According to the fourth embodiment, the total energy fed to the coil 21a from both of the capacitors C2 and C1 can be steadied irrespective of the characteristics change in the capacitor C2 due to temperature, thereby ensuring high accuracy in fuel injection.

It should be appreciated that, in the fourth embodiment, the control circuit 25 corresponds to the controlling means.

The control circuit 25 may be configured to estimate the temperature in the fuel injection control apparatus 50 based on environmental temperature outside the apparatus 50, such as the temperature of cooling water or intake air of the engine. In this case, the control circuit 25 may be configured to estimate the temperature in the apparatus 50 as being high when the temperature of the cooling water or the intake air is higher. Such a configuration can eliminate the necessity of providing the temperature detection circuit 27 in the apparatus 50.

The modifications (1) to (4) are also applicable to the present fourth embodiment.

Some embodiments of the present invention have been described above. As a matter of course, the present invention is not limited to these embodiments but may be implemented in various modes without departing from the spirit of the present invention.

For example, the capacitors C2 and C3 are not limited to stacked ceramic capacitors, but may be other types of capacitors. Further, the switches 11 to 15 may be other types of transistors, such as bipolar transistors.

The DCDC converters 23 and 29 may not be limited to the ones which are boosted utilizing flyback voltage of the inductor, but may be charge-pump type booster circuits, for example.

The present invention may be applicable not only to fuel injection control apparatuses but also to any apparatus that drives electromagnetic valves. Also, the electromagnetic valve may be a normally-opened type, whose valve is closed upon supply of current to the coil.

(Modifications)

The sub-discharging means may be a capacitor whose one end is connected to a point in the current path, which point is closer to the coil than from the discharge switching element and the other end is connected to a potential lower than the high voltage (i.e. voltage generated by the charging means to charge the discharging capacitor).

This configuration can reduce elements that are provided as the sub-discharging means. In this configuration, when the discharge switching element is turned on, the capacitor constituting the sub-discharging means is charged by a portion of the energy discharged from the discharging capacitor and, when the discharge switching element is turned off, discharging is started from the capacitor constituting the sub-discharging means to the coil.

The sub-discharging means may also be made up of a capacitor and a connection switching element which, when turned on, can electrically connect the capacitor between a point in the current path, which point is closer to the coil than from the discharge switching element and a potential lower than the high voltage.

This configuration can switch the sub-discharging means between effectiveness and ineffectiveness by turning on/off the connection switching element. For example, when the connection switching element is left turned on, the capacitor becomes effective to serve as the sub-discharging means having the same effects as mentioned above. When the connection switching element is left turned off, the capacitor becomes ineffective to serve as a conventional apparatus without having the sub-discharging means. Thus, switching control can be realized, which permits the sub-discharging means to be effective only when there is a necessity of reducing the emission noise generated when the discharge switching element is turned off.

More specifically, when the sub-discharging means is permitted to be effective, the coil of the electromagnetic valve will be supplied with electrical energy both from the discharging capacitor and the capacitor constituting the sub-discharging means, increasing the factors for varying the energy supplied to the coil in comparison with a conventional apparatus. Thus, in case reduction in the emission noise is placed above the accuracy in the timing for starting operation of the electromagnetic valve (i.e. accuracy in the amount of energy to be supplied to the coil), the switching control can be advantageously performed by permitting the sub-discharging means to be effective. Contrarily, in case the latter is placed above the former, the switching control can be advantageously performed by permitting the sub-discharging means to be ineffective.

In case the sub-discharging means is permitted to be effective, the on/off control may be performed, for example, by turning on the connection switching element simultaneously with the turning on of the discharge switching element and turning off the connection switching element upon completion of discharging to the coil from the capacitor constituting the sub-discharging means.

In the electromagnetic valve driving apparatus, the sub-discharging means may be provided in plural number. This configuration can vary the total capacitance of the sub-discharging means according to the number of connection switching elements to be turned on (i.e. the number of sub-discharging means permitted to be effective). Thus, this configuration can advantageously change the total amount of capacitance of the sub-discharging means in an active manner according to the desired degree of reducing emission noise produced at the time of turning off the discharge switching element. In particular, in case reduction in the emission noise is placed above the accuracy in the timing for starting operation of the electromagnetic valve, the total capacitance of the sub-discharging means can be increased by increasing the number of the connection switching elements to be turned on. Contrarily, in case the latter is placed above the former, total capacitance of the sub-discharging means can be decreased by decreasing the number of the connection switching elements to be turned on. For example, application of the present invention to the fuel injection control apparatus as shown in FIG. 12 may enable change in the total capacitance of the sub-discharging means according to the traveling conditions of the vehicle, such as engine speed.

In the electromagnetic valve driving apparatus, the sub-discharge charging means is provided, which charges a capacitor constituting the sub-discharging means in case both of the discharge switching element and the connection switching element are turned off. The connection switching element is adapted to be turned on when the discharge switching element is brought into an off-state from an on-state, or during a period from when the discharge switching element is turned on to when it is turned off, and to be turned off upon completion of discharging to the coil from the capacitor constituting the sub-discharging means.

This configuration enables charging of the capacitor constituting the sub-discharging means by using the sub-discharge charging means, which is different from the discharging capacitor, and thus can supply substantially all the energy discharged from the discharging capacitor to the coil. Accordingly, abrupt discharge can be performed for the coil when the discharge switching element is turned on, leading to reduction in the operational response time that lasts from when the discharge switching element is turned on up until when the electromagnetic valve is brought into a state of operation.

The sub-discharging means may only be a capacitor having discharge responsiveness, which enables start of discharging to the coil prior to the circulation of current to the coil through the circulating means, after the discharge switching element has been turned off. Such a type of capacitors can be considered to include one whose discharge speed is higher than that of the discharging capacitor. In particular, while aluminium electrolytic capacitors and film capacitors having large capacitance are typically used as discharging capacitors, a capacitor constituting the sub-discharging means may preferably be a stacked ceramic capacitor having smaller equivalent series inductance (ESL) and higher discharge speed than the aluminium electrolytic capacitors and the film capacitors. Use of a stacked ceramic capacitor, for example, having high discharge speed as a capacitor constituting the sub-discharging means may reduce the delay in the discharge performed by the sub-discharging means, leading to the reduction in the adverse effect caused to the operational responsiveness of the electromagnetic valve.

In one mode of the electromagnetic valve driving apparatus of the present invention, the controlling means for controlling the on/off state of the discharge switching element is adapted to measure a period of discharge from the sub-discharging means (particularly, a period of discharge from the sub-discharging means to the coil), and to adjust the timing for turning off the discharge switching element based on the discharge periods measured in the past.

This configuration can attain steadiness, so that the total energy fed to the coil from both of the discharging capacitor and the sub-discharging means will be a target feeding energy, irrespective of the characteristics variation (e.g., vibration in manufacture, elapsed time or temperature) in the components constituting the sub-discharging means.

For example, variation of slight increase in the capacitance of the capacitor constituting the sub-discharging means may elongate the time of discharge from the sub-discharging means to the coil, while increasing the energy fed to the coil from the sub-discharging means. Thus, in case the period of discharge from the sub-discharging means to the coil is longer than a reference, such control may be performed as to put ahead the timing for turning off the discharge switching element by a period corresponding to the difference, so that the energy fed to the coil from the discharging capacitor can be reduced. In this way, the total energy fed to the coil can be kept constant.

The period of discharge from the sub-discharging means may be measured, for example, at every fuel injection or once in a plurality of fuel injections, or only at an initial injection since the apparatus has been started. In case of the former, an average of the plurality of measurements may be used, while the latter can reduce the processing load of measurement.

In one mode of the electromagnetic valve driving apparatus of the present invention, the controlling means for controlling the on/off state of the discharge switching element is adapted to adjust the timing for turning off the discharge switching element, based on the temperature in the apparatus.

This configuration can attain steadiness so that the total energy fed to the coil from both of the discharging capacitor and the sub-discharging means will be a target feeding energy, irrespective of the characteristics variation in the components constituting the sub-discharging means due to temperature.

For example, use of a capacitor, which will have larger capacitance with the increase of the temperature, so as to serve as the capacitor constituting the sub-discharging means, may enable feeding of larger energy to the coil from the sub-discharging means with the increase of the temperature. Thus, the total energy fed to the coil can be kept constant by performing such control as to bring the timing for turning off the discharge switching element to an earlier time point as the temperature becomes higher. Contrarily, for example, in case a capacitor, which will have larger capacitance with the decrease of the temperature, is used as the capacitor constituting the sub-discharging means, the total energy fed to the coil can be kept constant by performing such control as to bring the timing for turning off the discharge switching element to an earlier time point as the temperature becomes lower.

Instead of configuring the controlling means so as to detect temperature in the apparatus, the controlling means may be configured so as to estimate temperature in the apparatus based on the environmental temperature outside the apparatus. This configuration can eliminate the necessity of providing the apparatus with an element and a circuit for detecting temperature. When the present invention is applied to the fuel injection control apparatus as shown in FIG. 12, the environmental temperature outside the apparatus can include, for example, the temperature of the cooling water or the intake air of the engine.

What is claimed is:

1. An electromagnetic valve driving apparatus comprising:
    a discharging capacitor in which electrical energy is stored to perform discharge to a coil of an electromagnetic valve;
    charging means that charges the discharging capacitor by generating high voltage from power source voltage, the high voltage being higher than that of the power source voltage;
    a discharge switching element, which is provided in series in a current path extending from the discharging capacitor to a high-side terminal of the coil and is turned on at the beginning of a driving period for supplying current to the coil to establish electrical connection between the discharging capacitor and the coil, so that current is discharged from the discharging capacitor to the coil, for bringing the electromagnetic valve into an operation state;
    controlling means that performs on/off control of the discharge switching element;
    circulating means, which is provided in the current path residing between a point closer to the coil than from the discharge switching element and a ground line, that circulates current to the coil when the discharge switching element is turned off and discharge from the discharging capacitor to the coil is completed in response to turning off of the discharge switching element; and
    sub-discharging means, which is provided in the current path at a point closer to the coil than from the discharge switching element, that starts discharge to the coil in response to the turning off of the discharge switching element, and that circulates current to the coil through the circulating means in response to the completion of the discharge to the coil.

2. The electromagnetic valve driving apparatus according to claim 1, wherein the sub-discharging means includes a capacitor whose one end is connected to a point in the current path, which point is closer to the coil than from the discharge switching element and whose other end is connected to a potential lower than the high voltage.

3. The electromagnetic valve driving apparatus according to claim 1, wherein the sub-discharging means includes a capacitor and a connection switching element, which, in response to turning on of the connection switching element, electrically connects the capacitor to the current path residing between a point closer to the coil than from the discharge switching element and a potential lower than the high voltage.

4. The electromagnetic valve driving apparatus according to claim 3, wherein the sub-discharging means is composed of plural sub-discharging means.

5. The electromagnetic valve driving apparatus according to claim 3, further comprising
    sub-discharge element charging means that charges the capacitor that serves as the sub-discharging means when both of the discharge witching element and the connection switching element are turned off, wherein
    the connection switching element is turned on when the discharge switching element is brought into an off-state from an on-state or during a period from turning-on to turning-off of the discharge switching element, and is turned off upon completion of discharge to the coil from the capacitor.

6. The electromagnetic valve driving apparatus according to claim 2, wherein the capacitor constituting the sub-discharging means is of a type having higher discharge speed than the discharging capacitor.

7. The electromagnetic valve driving apparatus according to claim 1, wherein the controlling means includes means that measures a period of discharge from the sub-discharging means and for adjusting timing for turning off the discharge switching element based on the measured discharge periods in the past.

8. The electromagnetic valve driving apparatus according to claim 1, wherein the controlling means includes means that adjusts the timing for turning off the discharge switching element based on temperature in the apparatus.

9. The electromagnetic valve driving apparatus according to claim 8, wherein the controlling means is configured to estimate temperature in the apparatus based on environmental temperature outside the apparatus.

10. The electromagnetic valve driving apparatus according to claim 1, wherein the electromagnetic valve is a fuel injection valve for injecting and supplying fuel to each of cylinders in an internal combustion engine loaded on a vehicle.

11. The electromagnetic valve driving apparatus according to claim 4, wherein:
    the apparatus further comprises sub-discharge element charging means that charges the capacitor which serves as the sub-discharging means when both of the discharge switching element and the connection switching element are turned off; and
    the connection switching element is turned on when the discharge switching element is brought into an off-state from an on-state or during a period from turning-on to turning-off of the discharge switching element, and is turned off upon completion of discharge to the coil from the capacitor.

12. The electromagnetic valve driving apparatus according to claim 3, wherein the capacitor which serves as the sub-discharging means is of a type having higher discharge speed than the discharging capacitor.

13. The electromagnetic valve driving apparatus according to claim 4, wherein the capacitor which serves as the sub-discharging means is of a type having higher discharge speed than the discharging capacitor.

14. The electromagnetic valve driving apparatus according to claim 5, wherein the capacitor which serves as the sub-discharging means is of a type having higher discharge speed than the discharging capacitor.

15. The electromagnetic valve driving apparatus according to claim 2, wherein the controlling means includes means that measures a period of discharge from the sub-discharging means and adjusts timing for turning off the discharge switching element based on the measured discharge periods in the past.

16. The electromagnetic valve driving apparatus according to claim 2, wherein the controlling means includes means that adjusts the timing for turning off the discharge switching element based on temperature in the apparatus.

17. A fuel injection control apparatus for driving a fuel injection valve for injecting and supplying fuel to each of cylinders in an internal combustion engine loaded on a vehicle, comprising:

a discharging capacitor in which electrical energy is stored to perform discharge to a coil of an electromagnetic valve constituting the fuel injection valve;

charging means that charges the discharging capacitor by generating high voltage from power source voltage, the high voltage being higher than that of the power source voltage;

a discharge switching element, which is provided in series in a current path extending from the discharging capacitor to a high-side terminal of the coil and is turned on at the beginning of a driving period for supplying current to the coil to establish electrical connection between the discharging capacitor and the coil, so that current is discharged from the discharging capacitor to the coil, for bringing the electromagnetic valve into an operation state;

controlling means that performs on/off control of the discharge switching element;

circulating means, which is provided in the current path residing between a point closer to the coil than from the discharge switching element and a ground line, that circulates current to the coil when the discharge switching element is turned off and discharge from the discharging capacitor to the coil is completed in response to turning off of the discharge switching element; and sub-discharging means, which is provided in the current path at a point closer to the coil than from the discharge switching element, that starts discharge to the coil in response to the turning off of the discharge switching element, and that circulates current to the coil through the circulating means in response to the completion of the discharge to the coil.

18. The fuel injection control apparatus according to claim 17, wherein the sub-discharging means includes a capacitor whose one end is connected to a point in the current path, which point is closer to the coil than from the discharge switching element and whose other end is connected to a potential lower than the high voltage.

19. The fuel injection control apparatus according to claim 17, wherein the sub-discharging means includes a capacitor and a connection switching element, which, in response to turning on of the connection switching element, electrically connects the capacitor to the current path residing between a point closer to the coil than from the discharge switching element and a potential lower than the high voltage.

20. The fuel injection control apparatus according to claim 17, wherein the internal combustion engine is a diesel engine.

* * * * *